United States Patent [19]

Maw et al.

[11] Patent Number: 5,189,128
[45] Date of Patent: Feb. 23, 1993

[54] SOLUTION STABLE POLYIMIDE RESIN SYSTEMS

[75] Inventors: Taishih Maw, Yorktown Heights, N.Y.; Gina Kritchevsky, Danbury, Conn.; Frank Cheng, Spring Valley, N.Y.

[73] Assignee: Ciba-Geigy Corporation, Ardsley, N.Y.

[21] Appl. No.: 804,629

[22] Filed: Dec. 9, 1991

Related U.S. Application Data

[60] Continuation of Ser. No. 690,020, Apr. 23, 1991, abandoned, which is a division of Ser. No. 363,224, Jun. 8, 1989, abandoned, which is a continuation-in-part of Ser. No. 209,381, Jun. 20, 1988, abandoned.

[51] Int. Cl.$^5$ .............................................. C08F 26/06
[52] U.S. Cl. ...................................... 526/262; 526/258
[58] Field of Search ................................. 526/258, 262

[56] References Cited

U.S. PATENT DOCUMENTS

| | | | |
|---|---|---|---|
| 3,658,764 | 4/1972 | Lyan et al. | 260/79 |
| 4,038,251 | 7/1977 | Forgó et al. | 260/47 |
| 4,100,140 | 7/1978 | Zahir et al. | 526/90 |
| 4,127,615 | 11/1978 | Zahir et al. | 260/837 |
| 4,130,600 | 12/1978 | Zahir et al. | 260/830 |
| 4,131,632 | 12/1978 | Suzuki et al. | 260/834 |
| 4,371,719 | 2/1983 | Zahir et al. | 568/723 |

OTHER PUBLICATIONS

Abstract of U.S. Pat. No. Re. 29,316, Jul. 1977.

*Primary Examiner*—Joseph L. Schofer
*Assistant Examiner*—Alex H. Walker
*Attorney, Agent, or Firm*—JoAnn Villamizar; William A. Teoli, Jr.; Harry Falber

[57] ABSTRACT

The advanced polymaleimide reaction product and solutions thereof resulting from the reaction of polymaleimides with alkenylphenols or alkenyl phenol ethers in the presence of specified molar amounts of an amine catalyst at elevated temperatures, the desired degree of resin advancement being reflected in solution stability and melt viscosity values.

3 Claims, No Drawings

SOLUTION STABLE POLYIMIDE RESIN SYSTEMS

RELATED APPLICATIONS

This application is a continuation of application Ser. No. 690,020, filed Apr. 23, 1991, now abandoned, which is a divisional of Ser. No. 363,224 filed Jun. 8, 1989, now abandoned which is a continuation-in-part of Ser. No. 209,381 filed Jun. 20, 1988 now abandoned.

It is known that polymaleimides can be utilized for the preparation of various polyaddition and polymerization products. Particular emphasis has been placed on bis-maleimide materials which exhibit thermal stability and good mechanical properties and thus are being more frequently utilized in high performance composite applications.

The currently utilized bis-maleimide systems include aromatic amines or alkenyl phenols as coreactants. U.S. Pat. Nos. 3,658,764 and Re. 29,316 are examples of patents that disclose reaction products of unsaturated bis-imides and amines. U.S. Pat. Nos. 4,100,140, 4,127,615, 4,130,600 and 4,131,632 are examples of patents that disclose crosslinked polymers resulting from the reaction of polymaleimides with alkenyl phenols or alkenyl phenol ethers optionally in the presence of epoxy resins. U.S. Pat. No. 4,038,251 discloses polyamide/polyhydric phenol reaction products prepared in the presence of amines.

A standard polyimide product conventionally used for various prepreg applications comprises the reaction product of bismaleimidodiphenyl methane with methylene dianiline. The product is supplied as a solid powder to be dissolved in N-methylpyrrolidone for prepreg use. It has been noted, however, that the product is soluble only in the above noted solvent or similar high boiling, difficult to process solvents. Correspondingly, solution stability of these systems is limited as evidenced by rapidly occurring precipitation and viscosity increases. These factors necessitate that the prepolymer be formulated immediately prior to use.

Improvements in such systems are noted in the products disclosed in U.S. Pat. No. 4,100,140 (see above). Such products, based primarily on the reaction of bis-maleimidodiphenyl methane and diallyl bisphenol A prepared in the optional presence of amine polymerization catalysts, exhibit improved thermal, chemical and mechanical properties. However, these systems still have certain disadvantages in terms of storage stability and limited solubility. For example, the system is insoluble in conventional ketonic solvents and, when stored in higher boiling solvent solution, precipitates out of solution after short periods of time. Accordingly, its applicability for use in making solvent impregnated laminates is limited.

It is the primary object of this invention to provide polymaleimide-based reaction products which substantially eliminate the disadvantages encountered with prior art materials.

It is a further object to provide such improved reaction products without any substantial adverse impact on the thermal and mechanical properties thereof.

It is another object to provide a process with defined reaction parameters for preparing such materials.

Various other objects and advantages of this invention will become apparent from the following descriptive material.

It has now been surprisingly discovered that by reacting the polymaleimide with an alkenylphenol or alkenyl phenol ether in the presence of specified molar amounts of a basic catalyst at elevated temperatures in order to obtain a predetermined amount of resin advancement, polymaleimide prepolymers are obtained with significantly improved characteristics. Thus, by defining the process parameters in terms of catalyst composition, catalyst concentration, reaction time and reaction temperature, appropriately advanced prepolymers based on exhibited melt viscosity and resin solution stability are obtained which exhibit a broad range of improved and desired performance features. In particular, the reaction products are soluble in relatively low boiling solvents such as methyl ethyl ketone and propylene glycol methyl ether which facilitates subsequent processing thereof as evidenced by increased treating speeds (greater ease of solvent removal), decreased toxicity and reduced residual volatiles in the resulting prepregs. They are stable in solution for prolonged periods of time at varied storage temperatures as evidenced by the substantial absence of precipitation as well as in neat resin form. They exhibit greater flexibility of use by eliminating the need for mixing of powders and for two-component systems and by being available instead as preformulated, ready-to-use materials. The prepregs and laminates prepared with these systems exhibit substantially the same excellent thermal, chemical and mechanical properties as laminates and prepregs prepared with the prior art materials.

Applicable polyimides contain at least two radicals of the formula

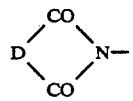

wherein D is a divalent radical containing a C=C bond. These polyimides are known compounds and are described, for example, in U.S. Pat. No. 4,100,140. They are preferably bismaleimides of the formula

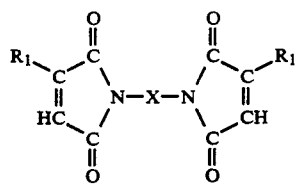

wherein $R_1$ is hydrogen or methyl and X is a divalent organic radical with 2-30 carbon atoms and, more particularly, $C_xH_{2x}$— with x=2-20, —CH$_2$CH$_2$SCH$_2$CH$_2$—, phenylene, naphthylene, xylylene, cyclopentylene, 1,5,5-trimethyl-1,3-cyclohexylene, 1,4-cyclohexylene, 1,4-bis(methylene)- cyclohexylene, and groups of the formula

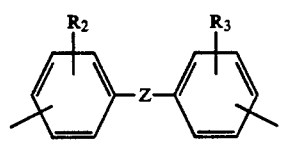

wherein $R_2$ and $R_3$ independently are chlorine, bromine, methyl, ethyl or hydrogen, and Z is a direct bond or methylene, 2,2-propylidine, —CO—, —O—, —S—, —SO— or —SO₂—. Bismaleimides which are particularly preferred are those in which R₁ is hydrogen, X is hexamethylene, trimethylhexamethylene, 1,5,5-trimethyl-1,3-cyclohexylene, or a group of the indicated formula in which Z is methylene, 2,2-propylidene or —O—.

The substances which follow may be mentioned as specific examples of known polyimides which are suitable for use in this invention: N,N'-ethylene-bis-maleimide, N,N'-hexamethylene-bis-maleimide, N,N'-m-phenylene-bis-maleimide, N,N'-p-phenylene-bis-maleimide, N,N'-4,4'-diphenylmethane-bis-maleimide (this is preferably employed), N,N'-4,4'-3,3'-dichloro-diphenylmethane-bis-maleimide, N,N'-4,4'-(diphenyl ether)-bis-maleimide, N,N'-4,4'-diphenyl-sulphone-bis-maleimide, N,N'-4,4'-dicyclohexylmethane-bis-maleimide, N,N'-alpha,alpha'-4,4'-dimethylenecyclohexane-bis-maleimide, N,N'-m-xylylene-bis-maleimide, N,N'-p-xylylene-bis-maleimide, N,N'-4,4'-diphenylcyclohexane-bis-maleimide, N,N'-m-phenylene-bis-citraconimide, N,N'-4,4'-diphenylmethane-bis-citraconimide, N,N'-4,4'-2,2-diphenylpropane-bis-maleimide, N,N'-alpha,alpha'-1,3-dipropylene-5,5-dimethyl-hydantoin-bis-maleimide, N,N'-4,4'-diphenylmethane-bis-itaconimide, N,N'-p-phenylene-bis-itaconimide, N,N'-4,4'-diphenylmethane-bis-dimethylmaleimide, N,N'-4,4'-2,2'-diphenylpropane-bis-dimethylmaleimide, N,N'-hexamethylene-bis-dimethylmaleimide, N,N'-4,4'-(diphenyl ether)-bis-dimethylmaleimide and N,N'-4,4'-diphenylsulphone-bis-dimethylmaleimide.

According to the invention, allylphenols and methallylphenols, or the ethers thereof, are preferably employed as the alkenylphenols or alkenylphenol ethers. Both mononuclear and polynuclear, preferably binuclear, alkenylphenols and alkenylphenol ethers can be employed. Preferably, at least one nucleus contains both an alkenyl group and a phenolic, optionally etherified OH group.

As is known, alkenylphenols are manufactured by rearrangement of the alkenyl ethers of phenols (for example of the allyl ether of phenol) by the action of heat (Claisen rearrangement). These alkenyl ethers are also obtained according to known processes by reacting phenols and, for example, allyl chloride in the presence of an alkali metal hydroxide and solvents. As is known, a condensation reaction takes place (elimination of an alkali metal chloride).

Typical examples are:
Compounds of formula I

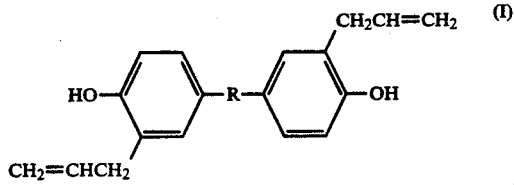

wherein R is a direct bond, methylene, isopropylidene, —O—, —S—, —SO— or —SO₂;
Propenyl-substituted phenols of formula II

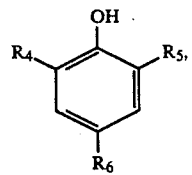

wherein R₄, R₅ and R₆ are each independently a hydrogen atom or $C_2$–$C_{10}$ alkenyl, preferably, an allyl or propenyl group, with the proviso that at least one of R₄ to R₆ is alkenyl, preferably a propenyl group;
Compounds of formula III

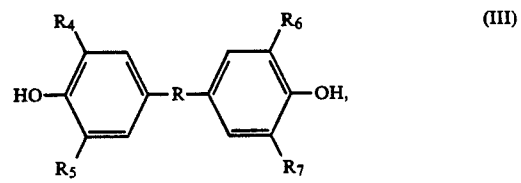

wherein R₄, R₅, R₆ and R₇ are each independently a hydrogen atom or $C_2$–$C_{10}$ alkenyl, preferably an allyl or propenyl group, with the proviso that at least one of R₄ to R₇ is alkenyl, preferably a propenyl group, and R is as defined for formula I; and
Compounds of formula IV

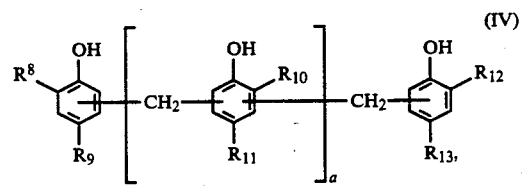

wherein R₈, R₉, R₁₀, R₁₁, R₁₂ and R₁₃ are each independently a hydrogen atom, $C_1$–$C_4$ alkyl, $C_2$–$C_{10}$ alkenyl, preferably allyl or propenyl, with the proviso that at least one of R₈ to R₁₃ is alkenyl, preferably a propenyl group, and a is a value from 0 to 10.

Compounds of formula III are preferred in which each of R₄ and R₆ is a propenyl group and each of R₅ and R₇ is a hydrogen atom and R is methylene, isopropylidene or —O—.

It is also possible to use mixtures of isomers of propenyl- and allyl-substituted mono- or polyhydric phenols. Among the mixtures of isomers it is preferred to use mixtures of propenyl- and allyl-substituted phenols of formula III, preferably those which are obtained by partial isomerization of allyl-substituted phenols of formula IIIa

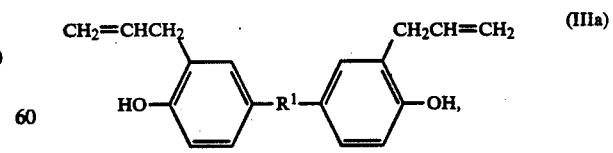

wherein R¹ is methylene, isopropylidene or —O—.

According to the invention, the use of mixtures of polynuclear alkenylphenols and/or alkenylphenol ethers with mononuclear alkenylphenols and/or alkenylphenol ethers also gives good results. The alkenylphenol ethers preferably employed are those substances which contain one or more molecular radicals of the formula V $$-O-R_3 \qquad (V)$$

in which $R_3$ denotes an alkyl radical with 1 to 10 C atoms, an aryl radical or an alkenyl radical, preferably allyl or methallyl, the O atom in formula V representing the phenolic ether bridge.

A further embodiment of the invention in the use of mixtures of those substances which contain only one OH group and only one alkenyl group on the aromatic nucleus with substances which contain several OH groups and/or several alkenyl groups on the aromatic nucleus, or of mixtures of the corresponding phenol ethers of these substances. The corresponding methallyl compounds can also be used.

Such alkenyl-substituted phenols and polyols are disclosed e.g. in specification U.S. Pat. Nos. 4,100,140 and 4,371,719.

Typical materials include O,O'-diallyl-bisphenol A, 4,4'-dihydroxy-3,3'-diallyldiphenyl, bis(4-hydroxy-3-allylphenyl)methane, 2,2-bis-(4-hydroxy-3,5-diallylphenyl)propane, eugenol, O,O'-dimethallyl-bisphenol A, 4,4'-dihydroxy-3,3'-dimethallyldiphenyl, bis-(4-hydroxy-3-methallylphenyl)methane, 2,2-bis-(4-hydroxy-3,5-dimethallylphenyl)-propane, 4-methallyl-2-methoxyphenol, 2,2-bis-(4-methoxy-3-allylphenyl)-propane, 2,2-bis(4-methoxy-3-methallylphenyl)propane, 4,4'-dimethoxy-3,3'-diallyldiphenyl, 4,4'-dimethoxy-3,3'-dimethallyldiphenyl, bis(4-methoxy-3-allylphenyl)methane, bis(4-methoxy-3-methallylphenyl)methane, 2,2-bis(4-methoxy-3,5-diallylphenyl)propane, 2,2-bis-(4-methoxy-3,5-dimethallylphenyl)propane, 4-allylveratrole and 4-methallyl-veratrole.

In terms of relative concentration, the alkenyl phenol component or a mixture thereof is employed in a range of 0.05 to 2.0 moles per mole of maleimide, and preferably in a range of 0.1 to 1.0, and most preferably in a 1:1 molar ratio.

Applicable catalysts are basic in nature and are particularly tertiary, secondary and primary amines or amines which contain several amino groups of different types (for example mixed tertiary/secondary amines) and quaternary ammonium compounds. These amine catalysts can be either monoamines or polyamines. Tertiary aliphatic amines are preferred. The substances which follow are to be listed as examples of such amine catalysts: diethylamine, tributylamine, triethylamine, tripropylamine, triamylamine, benzylamine, tetramethyldiaminodiphenylmethane, N,N-diisobutylaminoacetonitrile, N,N-dibutylaminoacetonitrile, heterocyclic bases, such as quinoline, N-methylpyrrolidine, imidazole, benzimidazole and their homologues, and also mercaptobenzothiazole, Examples of suitable quaternary ammonium compounds which may be mentioned are benzyltrimethylammonium hydroxide and benzyltrimethylammonium methoxide. Tributylamine and tripropylamine are preferred.

The method of preparation of the reaction products of this invention is established in order to obtain prepolymers of predetermined advancement. A key element is the amount of catalyst utilized in the advancement reaction. Thus, applicable concentrations of amine range from about 0.01–0.11 moles of amine per mole of bismaleimide and preferably 0.025–0.075 moles per mole of bismaleimide (i.e. concentration stated on basis of two maleimide moieties). In selecting the reaction conditions, a practitioner must strike a balance between catalyst concentration and the other process variables inasmuch as higher catalyst concentrations will tend to maximize the increase in solution stability while lower amounts within the range will improve other characteristics in preference to solution stability. This balancing of variables will also permit the use of catalyst concentrations somewhat beyond the lower and upper limits. However, catalyst concentrations falling significantly below the minimum concentration do not yield resins with improved solution or storage stability, while catalyst concentrations substantially exceeding the prescribed maximum will tend to gel the resin solution during preparation or to produce resins with high resin solution viscosities and with inferior mechanical and thermal properties.

Correspondingly, the degree of resin advancement is a function of reaction time and temperature after catalyst addition. This advancement parameter is to be monitored by the measurement of resin melt viscosity. Resin melt viscosity is measured with an ICI Cone & Plate Viscometer using a 0–100 poise scale at 125° C. and will generally range from 20 to 85 poise, and preferably 50–70 poise, for the advanced resin systems. Gel time may be used as an additional parameter and reflects the time to total gel formation as determined at a temperature of 170° C. and will generally range from about 80 to 550 seconds for the advanced resin systems of this invention.

The advancement procedure thus involves blending the maleimide and alkenyl phenol and heating the blend at a temperature of from 25° to 125° C. until a clear melt is obtained. Thereafter, the catalyst is added and the reaction continued for the appropriate amount of time at temperatures ranging from 110° to 130° C., whereupon substantially all of the catalyst is removed under vacuum. The resulting prepolymer resins may then be cast in the melt or formed as desired and cured at temperatures of between 100°–250° C. for the appropriate periods of time.

However, it is preferred for purposes of this invention to form a resin solution by adding the desired solvent system to the resin at the conclusion of the reaction. High solids (up to about 75%, by weight), generally low viscosity solutions are thus prepared which are stable for months at room temperature without precipitation and which are directly available for impregnating glass or other fabrics or fibers for laminate preparation. A wide variety of low boiling solvents (boiling points up to of about 160° C. and preferably up to about 100° C.) may be used including ketones such as acetone, methyl ethyl ketone and methyl isobutyl ketone; glycol ethers and glycol ether acetates such as propylene glycol methyl ether, propylene glycol methyl ether acetate, ethylene glycol methyl ether, ethylene glycol ethyl ether and glycol ethyl ether acetate; hydrocarbons such as toluene and anisole; dimethylformamide; and mixtures thereof; with the ketones and ketone/ether blends (preferably 1:1) being of particular interest. Blends of ketones with certain higher boiling solvents are also applicable.

Prepolymers such as those described above have application in a broad range of end uses such as in printed circuit boards, castings, composites, molding compounds, adhesives and coatings. Thus, the modified resin solutions or melts are utilized to impregnate various fibers or fabrics for eventual use in printed circuit boards or various laminating applications. Techniques for preparing laminates are well known. Such laminates may be prepared by compression or autoclave molding and may comprise a broad range of thicknesses. Techniques for preparing prepregs are well known to those skilled in the art. In terms of preparing honeycomb skins and structural parts, graphite, glass and Kevlar reinforced skins and parts as well as others can be readily prepared from the instant systems.

The prepolymers prepared according to the invention can furthermore be mixed, at any stage before cure, with usual modifiers such as extenders, fillers and reinforcing agents, pigments, dyestuffs, organic solvents, plasticizers, tackifiers, rubbers, accelerators, diluents, and the like. As extenders, reinforcing agents, fillers and pigments which can be employed in the curable mixtures according to the invention there may be mentioned, for example: coal tar, bitumen, glass fibers, boron fibers, carbon fibers, cellulose, polyethylene powder, polypropylene powder, mica, asbestos, quartz powder, gypsum, antimony trioxide, bentones, silica aerogel ("aerosil"), lithopone, barite, titanium dioxide, carbon black, graphite, iron oxide, or metal powders such as aluminum powder or iron powder. It is also possible to add other usual additives, for example, flameproofing agents, agents for conferring thixotropy, flow control agents such as silicones, cellulose acetate butyrate, polyvinyl butyrate, waxes, stearates and the like (which are in part also used as mold release agents) to the curable mixtures.

As previously noted, the prepolymers so prepared are distinguished by increased neat resin stability; solubility at high solids content in a broad range of solvents, particularly low boiling solvents; solution and storage stability at a broad range of temperatures; and good thermal, mechanical and chemical properties.

The following examples illustrate the preferred embodiments of this invention. In these examples, all parts given are by weight unless otherwise noted.

EXAMPLE 1

This example illustrates the preparation of typical advanced resin systems of this invention.

A flask equipped with thermometer, mechanical stirrer and condenser is charged with 154 grams (0.5 mole) 4,4'-bismaleimidodiphenylmethane and 179 grams (0.5 mole) O,O'-diallyl bisphenol A and heated to 120°-125° C. until a clear melt is obtained. A vacuum of 20-30 mmHg is applied for 10 minutes and the mixture is allowed to cool to 110° C. The tributylamine (TBA) catalyst is added to the mixture in the indicated amounts after releasing the vacuum, and the mixture is further reacted for the indicated time period at 110° C., i.e. until the desired melt viscosity is obtained. Vacuum (20-30 mmHg) is applied to the system for another 10 minutes at 110° C. The temperature of the thermal controller is then reset to 75° C. and 222 grams of the indicated solvent is added to the hot resin. The resin solution is stirred at 75° C. for one hour and then cooled to room temperature.

| Formulation # | Catalyst Conc. (moles/mole of bismaleimide) | Reaction Time (min.) |
|---|---|---|
| 1 | — | 100 |
| 2 | — | 240 |
| 3 | 0.025 | 100 |
| 4 | 0.025 | 125 |
| 5 | 0.050 | 70 |
| 6 | 0.050 | 95 |

-continued

| Formulation # | Catalyst Conc. (moles/mole of bismaleimide) | Reaction Time (min.) |
|---|---|---|
| 7 | 0.065 | 100 |
| 8 | 0.075 | 100 |
| 9 | 0.075 | 50 |
| 10 | 0.100 | 45 |
| 11 | 0.100 | 75 |
| 12 | 0.200 | — |

EXAMPLE 2

The melt viscosity of each solid resin melt of Example 1 before adding solvent is determined on an ICI Viscometer at 125° C. The characteristics of the resin solutions (adjusted to 60% solids) of Example 1 are also determined as follows:

Storage Stability (SS)—The time to formation of a layer of precipitate at the bottom of the storage container maintained at room temperature.

Gel Time (GT)—The observed time to total gel formation when two grams of solution are placed in an open container on a hot plate maintained at 170° C.

Viscosity (Visc.)—Determined on Brookfield Viscometer at 12 rpm with a #1 spindle at 25° C. on original sample and on sample after storage for six months at room temperature (final).

| Formulation # | MV (poise) | SS (days) | GT (sec) | Visc. (cps) init. | Visc. (cps) final |
|---|---|---|---|---|---|
| 1 | 7 | 0 | 0 | — | — |
| 2 | 30 | 0 | — | — | — |
| 3 | 17 | 0 | 413 | — | — |
| 4 | 80 | >300 | 80 | 95 | — |
| 5 | 12 | 3 | 515 | — | — |
| 6 | 31 | >300 | — | 55 | — |
| 7 | 56 | >270 | 503 | 108 | 250 |
| 8 | 67 | >270 | 555 | 150 | 355 |
| 9 | 21 | >300 | 312 | 60 | — |
| 10 | 27 | >330 | 303 | 60 | — |
| 11 | 75 | >330 | 453 | — | — |
| 12 | — | 0* | — | — | — |

*resin solution gelled during preparation.

These data thus clearly indicate the correlation of process variables required in order to obtain the improved systems of this invention. Thus, the absence of catalyst (1,2) or the presence of excess catalyst (12) results in poor resin solution stability. The presence of adequate catalyst but inadequate reaction conditions relative thereto (3,5) again results in low melt viscosity and inadequate solution stability. Sufficient melt viscosity but no catalyst (2) also results in poor solution stability. It is balancing of the variables as noted in the other formulations that provides the increased resin solution stability of the systems of this invention as particularly evidenced by the absence of precipitation.

EXAMPLE 3

Additional formulations are prepared according to the procedure of Example 1 and tested according to the procedures of Example 2. In these instances, the reaction times after catalyst addition at 110°-120° C. are again varied, the solvent is methyl ethyl ketone and tripropylamine (TPA) and TBA are utilized as catalysts.

Cat. Conc.

| Formulation # | Catalyst | (mole/mole of bismaleimide) | Reaction Time (min.) |
|---|---|---|---|
| 13 | TBA | 0.075 | 25 |
| 14 | TPA | 0.030 | 120 |
| 15 | TPA | 0.030 | 150 |

| Formulation # | SS (days) | MV (poise) | GT (sec.) | Visc (cps) initial | final |
|---|---|---|---|---|---|
| 13 | 30 | 12 | >600 | — | — |
| 14 | 5 | 21 | 253 | — | — |
| 15 | >240 | 85 | 205 | 98 | — |

These data thus further illustrate the impact of the correlation of variables to achieve the prescribed resin advancement on physical properties and performance.

EXAMPLE 4

The resin systems are prepared as in Example 1. Rather than preparing solutions thereof, cured resin plaques are prepared by casting the degassed molten solution into 0.3 cm thick sheet molds and curing using the following cure cycle:

1 hr. @180° C.
2 hrs. @200° C.
6 hrs. @250° C.

Fully cured panels are obtained.

The panels are tested at room temperature tensile properties using ASTM D-638 and for glass transition temperature (Tg) using a Perkin-Elmer DMA run at 20° C./min.

| Formulation # | Catalyst | Catalyst Conc. (mole/mole of bismaleimide) |
|---|---|---|
| 16 | — | — |
| 17 | TBA | 0.030 |
| 18 | TBA | 0.050 |
| 19 | TBA | 0.065 |
| 20 | TBA | 0.075 |
| 21 | TPA | 0.01 |
| 22 | TPA | 0.02 |
| 23 | TPA | 0.03 |
| 24 | TPA | 0.05 |

| | Formulation # | | | | | | | |
|---|---|---|---|---|---|---|---|---|
| | 16 | 17 | 18 | 19 | 20 | 21 | 22 | 23 | 24 |
| Tensile Modulus (ksi) | 549 | — | — | 690 | 667 | 741 | 548 | 593 | — |
| Tensile Strength (ksi) | 8.2 | — | — | 6.7 | 5.4 | 10.0 | 7.3 | 9.5 | — |
| Tensile Elongation (%) | 1.6 | — | — | 1.1 | 0.8 | 2.1 | 1.5 | 1.9 | — |
| Tg (°C.) | 328 | 310 | 250 | 257 | 210 | 340 | 340 | 330 | 270 |

The above results indicate the relatively limited adverse impact on thermal and mechanical properties of the cured resins of the instant invention as a result of the advancement process of this invention relative, for example, to control 16.

EXAMPLE 5

A flask equipped with thermometer, mechanical stirrer and condenser is charged with one mole 4,4'-bismaleimidodiphenylmethane and one mole O,O'-diallyl bisphenol A and heated to 120°–125° C. until a clear melt is obtained. A vacuum of 20–30 mmHg is applied for 10–15 minutes and the mixture is allowed to cool to 110° C. TPA catalyst (0.03 mole) is added after releasing the vacuum and the reaction continues for an additional 30 minutes at 110° C. Vacuum (20 mm Hg) is applied at 110° C. for 60 minutes and then at 120° C. for 30 minutes whereupon the vacuum is released.

Thereafter, 60 parts of the resin are blended with 20 parts methyl ethyl ketone at 80° C. and the resin cooled to room temperature over the period of an hour. The solution is then mixed with 20 parts propylene glycol methylether to produce the final resin solution.

The resin system exhibits the following excellent characteristics:

| solid resin melt viscosity | 63 poise |
|---|---|
| solid resin gel time | 218 seconds |
| resin solution viscosity | 200 cps |
| resin solution stability | no precipitation after 6 months |

Summarizing, it is seen that this invention provides improved maleimide systems, said improvements stemming from the introduction of the desired degree of resin advancement. Variations may be made in procedures, proportions and materials without departing from the scope of the invention as defined by the following claims.

What is claimed is:

1. A process for preparing a storage stable product containing imide groups dissolved in a non-aqueous solvent medium comprising the steps of (1) reacting at an elevated temperature (a) a polyimide containing at least two radicals of the formula

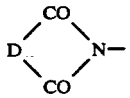

wherein D is a divalent radical containing a C═C bond, and (b) from about 0.05 to 2.0 moles per mole of component (a) of an alkenyl phenol, an alkenyl phenol ether or mixtures thereof, in the presence of from about 0.01–0.11 moles per one mole of for each two imide moieties in component (a) of a primary, secondary or tertiary amine, mixed secondary/tertiary amine, heterocyclic base or quaternary ammonium compound as a basic catalyst, said reaction product having a resin melt viscosity of from about 20 to 85 poise as measured on an ICI Cone & Plate Viscometer at 125° C., (2) substantially removing the catalyst, and (3) recovering the storage stable product, wherein subsequent to step (2) the reaction product is dissolved in a non-aqueous solvent medium and said solution is recovered.

2. The process of claim 1, wherein polyimide (a) is 4,4'-bismaleimidodiphenylmethane, (b) is O,O'-diallyl-bisphenol A and the tertiary amine is tripropylamine or tributylamine.

3. The process of claim 1, wherein said solvent medium is a ketone, glycol ether, glycol ether acetate, hydrocarbon, dimethylformamide or mixture thereof, said solvent medium having a maximum boiling point of 160° C.

* * * * *